United States Patent
Magrath

(10) Patent No.: US 7,205,917 B2
(45) Date of Patent: Apr. 17, 2007

(54) PULSE WIDTH MODULATOR QUANTISATION CIRCUIT

(75) Inventor: Anthony J. Magrath, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 11/110,858

(22) Filed: Apr. 21, 2005

(65) Prior Publication Data
US 2006/0158359 A1 Jul. 20, 2006

(30) Foreign Application Priority Data
Jan. 17, 2005 (GB) ................. 0500902.2

(51) Int. Cl.
*H03M 3/00* (2006.01)

(52) U.S. Cl. .................... 341/143; 341/144
(58) Field of Classification Search ............... 341/143, 341/144; 375/238
See application file for complete search history.

(56) References Cited

U.S. PATENT DOCUMENTS

| | | | |
|---|---|---|---|
| 3,541,461 A | 11/1970 | Brendzel | |
| 5,077,539 A | 12/1991 | Howatt | |
| 5,378,933 A | 1/1995 | Pfannenmueller et al. | |
| 5,933,453 A | 8/1999 | Lewison | |
| 6,107,876 A * | 8/2000 | O'Brien | 330/10 |
| 6,211,728 B1 | 4/2001 | Chen et al. | |
| 6,262,632 B1 | 7/2001 | Corsi et al. | |
| 6,472,933 B2 | 10/2002 | Hsu | |
| 6,614,297 B2 | 9/2003 | Score et al. | |
| 6,940,436 B2 * | 9/2005 | Hezar et al. | 341/143 |
| 2003/0031245 A1 * | 2/2003 | O'Brien | 375/238 |
| 2003/0042976 A1 | 3/2003 | Midya et al. | |
| 2003/0122615 A1 | 7/2003 | Zeff | |
| 2004/0210611 A1 * | 10/2004 | Gradishar et al. | 708/271 |

FOREIGN PATENT DOCUMENTS

| | | |
|---|---|---|
| DE | 10027164 | 12/2001 |
| EP | 1 471 640 | 10/2004 |
| WO | WO 2005/117253 | 12/2005 |

OTHER PUBLICATIONS

J. Vanderkooy, "New Concepts in Pulse-Width Modulation", Presented at AES 97th Convention, San Francisco, Nov. 10-13, 1994.

* cited by examiner

Primary Examiner—Rexford Barnie
Assistant Examiner—Joseph Lauture
(74) Attorney, Agent, or Firm—Dickstein Shapiro LLP

(57) ABSTRACT

The present invention relates to pulse width modulation (PWM) modulators, especially but not exclusively for digital audio applications; and to quantizers and power switching for the same. The present invention provides a pulse width modulation (PWM) modulator or converter having a guard band quantizer arranged to block low level signal inputs to the modulator in order to prevent narrow width output pulses. This arrangement is particularly advantageous when applied to tri-level PWM modulators, but can also be applied to other level PWM modulators such as bi-level for example. Quantization noise can be reduced by implementing the quantizer in a noise shaper circuit (or possibly a SDM) having loop feedback.

52 Claims, 11 Drawing Sheets

PULSE WIDTH MODULATOR QUANTISATION CIRCUIT

FIELD OF THE INVENTION

The present invention relates to pulse width modulation (PWM) modulators, especially but not exclusively for digital audio applications; and to quantisers and power switching for the same.

BACKGROUND OF THE INVENTION

Digital amplifiers are typically employed for high efficiency applications for example audio amplification in portable devices such as personal stereos where battery life is a significant consideration. They are also used in high power amplification where the high efficiency means that the size and cost of the power supplies and heat sinks can be reduced. These amplifiers often utilise pulse width modulation (PWM) to drive a switching power stage. However the source signals are typically stored as encoded sampled signals on a carrier such as a CD-ROM or as MP3 tracks on a memory device for example. During playback, these digital encoded signals are error-corrected and decompressed to give a sequence of digital words, each representing the instantaneous value of the audio signal, a signal format known as Pulse Code Modulation (PCM) Hence some kind of PCM-PWM Converter is needed to convert the encoded signal samples into a two- or three-level PWM signal.

A schematic of a digital amplifier for digital audio and employing a PCM-PWM Converter is shown in FIG. 1, the amplifier comprising an over-sampling filter 1, a Converter 2, a power switch 3, a low pass filter 4, and a headphone or loudspeaker load 5.

The input is a series of PCM digital words representing the original analogue signal amplitude levels sampled at successive sample instants, typically at an audio sampling rate $f_s$ of 48 kHz or 44.1 kHz. The over-sampling or interpolation filter 1 adds additional samples from the incoming audio source samples by interpolating between the actual samples, thereby effectively increasing the sampling rate as is known, to an interpolated sampling rate $f_i$ of say 8 times $f_s$. The over-sampled audio signal cin is fed to the Converter 2 which comprises a modulator to convert these words into a signal pwm_out comprising a series of pulses of varying width (PWM) suitable for switching the switching element 3, at a pulse repetition frequency (PRF) or PWM pulse frame rate $f_P$, equal to $f_i$, say. The power switch 3 switches a much larger output voltage into a low pass filter 4 which removes high-frequency components of this signal to give a smoothed analogue signal for applying to the headphone or speaker load 5. The switch element 3 outputs either a high level or a low level in the case of bi-level PWM or a high, mid-scale or low level in the case of tri-level PWM, and is switched at the high frequency $f_P$ with a duty cycle that is dependent on the sampled amplitude of the input signal.

A typical transistor switching bridge circuit for the switch element 3 is shown in FIG. 2, and comprises four MOSFET power transistors (T1–T4) arranged into two half bridges driving a load connected between output nodes B and C as shown and as is known and collectively referenced 3b. Bi-level operation is achieved by switching complementary transistors in each bridge on and off in pairs, for example T1 and T4 for one level, driving B high and C low, and T2 and T3 for the other level, driving B low and C high. In tri-level modulation, the mid-scale state is normally implemented by having the corresponding transistor from each half bridge either high or low at the same time—for example having both T1 and T2 on together, driving both B and C high, or T3 and T4, driving both B and C low, in each case giving zero differential output voltage. The detailed control of the gates of these four MOSFETs according to the high, mid-scale, or low output state requested by converter 2 is implemented in output control logic 3a inside power switch 3.

A tri-level waveform representing an analogue signal is shown in FIG. 3a. Tri-level modulation offers the advantage that the switching activity is halved with respect to bi-level modulation. This is because whenever a transition occurs, only one of the half-bridges changes state. Furthermore, tri-level modulation offers an absence of even order carrier components, as described for example in J Vanderkooy "New Concepts in Pulse-width Modulation" AES 97th Conference Preprint 3886 November 1994.

FIGS. 3b and 3c show the tri-level signalling for the switch element 3 of FIG. 2 in more detail. The top trace is the tri-level signal pwm_out from the converter 2 of FIG. 1. This is amplified as described above by independently controlling the half bridges of the switch 3. Thus for example controlling transistor T1 and T3 will control the voltage at node B; and similarly transistor T2 and T4 will control node C. Therefore with appropriate control of nodes B and C, the tri-level differential output signal A equal to B−C can be produced as an amplified version of pwm_out as is shown.

The PWM signal (A) shown represents a low-amplitude signal, so the high and low pulses are narrow. For an analogue PWM waveform, there would also be some extremely narrow pulses, but for a digital system the input level is quantised, so very small input levels will be rounded to exactly zero. Thus some pulse frames will have no pulse at all. In fact, for low amplitude signals, these zeros can be quite common. Given the "crest factor" of 20 dB or so in many audio sources, and the presence of quiet passages in most music, and the likely scenario where there is some upstream digital volume control attenuating the audio signal, rather than playing music at full volume, such low-amplitude signals are themselves quite common.

When a zero differential output is desired, either for the "off" part of a pulse frame, or for a whole pulse frame, there is a choice at every zero-going transition whether to turn both high-side devices (T1 and T2) on, or to turn both low-side devices (T3 and T4) on. FIGS. 3b and 3c show two different known schemes.

U.S. Pat. No. 6,614,297 discloses the switching scheme of FIG. 3c in which the choice is always to turn T3 and T4 on. This gives little common-mode signal, at least for low-level signals, and so can minimise some components of EMI. However this requires very short but accurate pulses, which are hard to achieve practically, especially when driving large high-current output devices because of the large narrow current pulses needed to drive the input capacitances of these output devices. In general, rather than instantaneously switching from off to a fixed on resistance, there will be a time during which the "on" resistance will still be ramping down to its asymptotic "on" resistance. Also, to avoid the risk of the upper FET, say, not being fully off before the lower FET is turned on, resulting in a high-current path between the supply rails, there is generally a deliberate delay introduced in the pre-driver circuitry. This ensures a delay between turning the upper FET off and turning the lower FET on and vice versa. However these precautions both narrow the resulting pulses and may cause narrow pulses to be swallowed altogether, causing a dead-band in the characteristic curve of output voltage versus input pulse width, analogous to the crossover distortion apparent in the typical output voltage versus input voltage characteristic of a Class AB or Class B amplifier output stage.

In addition, the load presented by the speaker 5 may have an inductive component and the low-pass filter 4 will usually be an L-C filter with an inductive component of impedance. Therefore during the interval when both devices are off, this inductive load will tend to fly past the positive or negative supply rail, depending on the inductor current. This waveform is caught by a diode rather than tied directly to the supply rail via a FET. Even if the characteristics of this diode are predictable the overshoot may still give some distortion of effective pulse width. In practice, whether on-chip or off-chip, the characteristics of these diodes will have a wide tolerance, uncorrelated with the electrical characteristics of other circuit elements and with a strong thermal dependence. Therefore the distortion will be unpredictable, foiling attempts to pre-distort to correct for it.

Furthermore, even if it were possible to drive the output devices very fast, the resulting fast edges could give troublesome high-frequency EMI components.

U.S. Pat. No. 6,211,728 discloses the switching scheme of FIG. 3b, in which the aforementioned choice is alternated every cycle. This avoids short pulses on either side, B or C, but gives rise to a common-mode full-amplitude square wave at half the sample frequency and odd harmonics thereof. This large common-mode signal is present even when the differential signal is small or even exactly zero and can give rise to excessive EMI in some applications. Also both sides switch once per cycle, even with zero signal. For small signals, with frequent "zeros", this is wasteful of switching energy consumed by the pre-drivers driving the output device gates.

A further subtlety in implementation of tri-level PWM concerns the location of the transitions. In standard or single sided PWM, only the leading or trailing edge of the pulse varies with the input signal, the other edge being fixed. In double-sided PWM, both leading and trailing edge of the pulse vary in order that the PWM pulses are centred symmetrically around the PRF (Pulse-Repetition Frequency) clock. To first order, as long as the output is on for the required fraction of each cycle, it will generate the corresponding contribution to the output waveform. But second order effects, such as the signal-dependent skewing of the "centroid" of the output pulse relative to the clock, give rise to distortion mechanisms in the single-sided schemes. Double sided PWM is more complicated to implement, but results in reduced distortion when compared with single sided PWM. Known analog schemes such as those described in U.S. Pat. No. 6,262,632, U.S. Pat. No. 6,614,297, and U.S. Pat. No. 5,077,539 can generate the double-sided modulation quite easily, but digital sampled-data generation is not so straightforward, particularly when pulse lengths of odd numbers of clocks are required.

A schematic for a PWM converter is illustrated in FIG. 4, the converter 2 typically comprising a word length reduction (WLR) circuit 6 and a PWM modulator circuit 7 with the output qout of WLR 6 coupled to the input pwm_in of PWM modulator 7. Word length reduction circuits reduce the word length of the digital sample values, for example quantising these from 16 bits to 8 bits by eliminating the (8) least significant bits (LSB). They are typically implemented using sigma delta modulators (SDM) or noise shaper circuits. For economy of explanation, the terms noise shaper and SDM will be used interchangeably in this application since they refer to similar techniques, both used to shape the spectrum of output quantisation noise. The SDM arrangement shown uses a Word Length Reduction quantiser $Q_{WLR}$ 12, a loop filter G(z) 11, and negative feedback to shape the spectrum of the extra quantisation noise generated, to move it away from the audio band up to higher frequencies. The feedback loop extends from the output of the quantiser 12 to the input of the WLR circuit 6 at adder 10. The reduced word length of the samples allows for reduced specification and hence cheaper modulators 7.

The PWM modulator 7 generates an output pwm_out with high, low and mid-scale states in tri-level applications. More precisely, in tri-level applications, the output pwm_out of PWM modulator 7 will typically comprise two or more parallel digital signals together indicative of the chosen one of these three states, which will then be translated by the output control logic (3a) within power switch 3 to generate the desired high-amplitude output signal to drive the load 5 via LP filter 4. But for economy of explanation we will refer to this signal pwm_out as a single tri-level signal. Signal pwm_out will generally consist of a string of pulses of high or low level, at the high frequency PWM pulse frame rate $f_P$, with a pulse width that is proportional to the amplitude of the modulator's input signal pwm_in, and a polarity determined by the MSB or sign bit of pwm_in.

In the implementation of FIG. 4, the modulator 7 utilises an absolute value circuit block 13 as well as the modulator function block 14, to which the MSB of pwm_in provides a "sign" input and the absolute value block 13 provides a "count" input. The PWM function block 14 uses a digital counter (described hereafter as the 'pulse width-counter') clocked off a higher-frequency system clock or bit-clock of frequency $f_B$, possibly 128 times $f_P$, to produce a pulse-width proportional to the value of "count". Depending on whether the pulse is centred within each pulse frame, or left-justified to the start of each pulse frame, either double- or single-sided modulation can be produced. Other modulator implementations could alternatively be used, for example using digital triangular waves to produce double-sided modulation, as is known, and described for example in U.S. Pat. No. 5,077,539. Similarly, a digital sawtooth waveform can be used to produce single-sided modulation.

As discussed above with reference to FIG. 3c, a problem with tri-level PWM is that at low signal levels the output pulse can be very short. This is because a signal close to zero is represented by an output which is predominantly zero, but with occasional short positive or negative pulses to represent the low-amplitude signal. An 8-bit noise shaper will produce 256 discrete amplitude levels, corresponding to 127 positive pulse widths and 128 negative pulse widths. With a typical pulse-repetition frequency of 352.8 kHz, the minimum pulse width is 1/(352800*128)=22 ns. Very short pulses are problematic for the output switching stage due to limitations in the feasible switching times associated with driving the MOSFETs, and also due to higher levels of EMI at high frequencies. Typical output stages are capable of transition times in the order of 10–30 ns, therefore the minimum pulse width will not be accurately represented, resulting in signal distortion and noise with low-amplitude inputs. One way of increasing the minimum pulse length is to reduce the resolution of the word length reduction circuit 6 by using a quantizer with fewer output bits. However, this introduces more quantisation noise and so has the effect of reducing SNR, unless much more aggressive and hence complex and costly noise-shaping architectures are used. On the other hand, the waveform scheme of FIG. 3b can cause EMI problems because of the common-mode energy and unnecessary power dissipation in the pre-drivers. So an improved waveform scheme with less common-mode and switching energy, but also with no requirement for such short pulses is desirable.

SUMMARY OF THE INVENTION

In general terms in one aspect the present invention provides a guard band quantiser for a pulse width modulation (PWM) based modulator or converter. The guard band quantiser is arranged to prevent narrow width output pulses. This arrangement is particularly advantageous when applied to tri-level PWM modulators, but can also be applied to other level PWM modulators such as bi-level for example. The guard band quantiser is arranged to block the output of low level non-zero signals to the modulator in order to prevent the narrow output pulses. The resulting extra quantisation noise can be moved to high frequencies above the audio band by implementing the quantiser in a noise shaper circuit (or possibly a SDM) having loop feedback.

In an embodiment, the guard-band quantiser is configured with a predetermined upper threshold and a corresponding predetermined lower threshold; which are centred about zero. The quantiser comprises logic arranged to "pass" its input signal onto its output when the corresponding input level is above an upper threshold value and below a lower threshold value. The logic is further arranged to issue an output chosen from one of a number of predetermined output levels from the quantiser output when the corresponding input level is between the upper threshold and the lower threshold. The predetermined output levels will include zero, and preferably also the upper and lower threshold values, depending on the input level. A single predetermined output level may alternatively be used, for example zero.

The modulator then outputs a pulse corresponding to the input signal to the quantiser when this is outside the bounds of the upper and lower thresholds, and output pulses corresponding to the predetermined output(s) of the quantiser when its input signal is between the upper and lower thresholds. Thus the modulator does not output any pulses less than a minimum width unless it is zero, even when only a low (e.g. audio) signal level, between the upper and lower thresholds, is input to the quantiser. In an embodiment the modulator will output pulses of widths corresponding to input signals below the lower threshold and above the upper threshold, or else corresponding to zero, the upper threshold or the lower threshold as appropriate. This avoids the problem of very short output pulses which the output bridge transistors cannot switch quickly enough, thereby reducing the level of distortion.

Whilst the modified quantisation does result in extra quantisation error and hence distortion, this is substantially moved out of the audio frequency band in embodiments using noise shaping around the guard-band quantiser. Alternatively other quantisation noise spectrum shaping circuits could be used, such as sigma delta modulators (SDM).

In particular in one aspect the present invention provides a quantising circuit according to claim 1.

A control signal which is dependent on the input signal is used to determine whether the output is forced to a predetermined output level. The input signal itself is used to select which predetermined output level. This allows the control signal to be dithered independently of the input signal in some embodiments. Alternatively the input signal itself may be dithered independently of the control signal, or both may be dithered. Dithering these signals reduces idle tones and can be implemented by adding a pseudorandom noise source to the input and/or control signal.

The quantiser circuit is particularly suitable for coupling to the input of a tri-level PWM modulator for digital audio applications, as it prevents low non-zero input signals and hence corresponding short output pulses from the modulator. It ensures a minimum pulse width or zero which mitigates the problem of finite output transistor switching time.

Preferably this quantising circuit also includes a "standard" Word Length Reduction, or second, quantiser which reduces the word length of its input signal in order to allow the implementation of a cheaper modulator. The second (WLR) quantiser is preferably coupled to the input of the first (guard band or GB) quantiser which in turn is coupled to the input of the modulator. Preferably the or each quantiser incorporates a feedback loop including a loop filter or equivalent about its quantising element. Additionally or alternatively the quantising circuit incorporates a feedback loop and loop filter around the two quantisers. These feedback loops reduce the distortion effects associated with quantisation of the input signal.

In another aspect there is provided a PWM converter comprising a PWM modulator for converting input signals into pulses having a width corresponding to the value of the input signal, and a word length reduction circuit coupled to the input of the modulator and comprising quantising means for quantising an n-bit input signal into an N-bit output signal, and means for blocking a non-zero output signal which is within a predetermined range. Preferably one of a number of predetermined output levels is selected depending on the input signal level within the predetermined range.

In another aspect there is provided a guard band quantiser circuit for use with a pulse width modulator, the quantiser receiving an n-bit input signal and outputting an n-bit output signal, the quantiser comprising means for forcing the output signal to one of a number of predetermined levels when the input signal is within a predetermined range.

In another aspect there is provided a quantiser circuit for use with a pulse width modulator, the quantiser comprising: an input for receiving an n-bit input signal; quantising means arranged to quantise said n-bit signal into a corresponding N-bit output signal; wherein said quantising means is further arranged to force a non-zero output signal to zero when said corresponding n-bit input signal is within a predetermined range of zero; an output for outputting said N-bit output signal.

Preferably said quantising means is further arranged to force said output signal to a non-zero threshold value when said corresponding input signal is within a predetermined range of said threshold value.

In general terms in a second aspect there is provided a PWM modulator for digital audio signals and which is arranged to convert an input signal into an output pulse having a width corresponding to the value of the input signal. The modulator is arranged to shift the timing of the leading and trailing edge of the pulse in order to implement double side PWM modulation. The leading and trailing edge time shifts are modulated by an offset value which varies with each odd value of the input signal in order to centre the output pulse on average with respect to an internal clock signal corresponding to the pulse repetition rate of the modulator. The offset value is processed by a feedback loop and loop filter. Preferably the loop and filter is implemented in a noise shaping circuit.

This reduces audio band distortion introduced by the varying offset value.

In an embodiment a shuffling circuit is used which generates a pulse offset value for controlling the position of the leading edge of the output pulses. The offset value is dependent on the value of the incoming signal sample, in other words its width. The larger the sample value, the smaller the offset. This will be an integer when the sample value is an even value, and fractional when the sample is odd. However since the PWM modulator can only implement whole or integer offset values, the fractional values need to be rounded to integer values. The rounding up and down needs to be controlled in order to minimise distortion. In the embodiment a quantiser is used to get the right number of bits and hence an integer number. This is arranged in a feedback loop in order to compensate for the quantisation error that this processing creates. The feedback loop provides noise-shaping, using either a noise-shaper or a delta-sigma architecture.

In particular in this aspect the present invention provides a double sided pulse width modulation circuit according to claim 31.

Advantageously the noise shaping processed offset arrangement can be combined with the above quantising circuit of the first aspect.

In general terms in a third aspect there is provided a power switching circuit for use with a tri-level PWM modulator and having two transistor half bridges each having two transistors. The circuit includes switching means arranged to only provide a state transition at one of said load connections when a corresponding state transition occurs in said PWM output signal, and wherein a non-zero pulse across the load is implemented by a state transition at one of said load connections followed after a period according to the width of the pulse by a state transition at the other load connection. Preferably the switching means is further arranged to determine the last half bridge that switched the output, in order that the next output state transition to mid-scale or zero is implemented using the other half bridge.

By using both half bridges to provide an amplified pulse, the switching times required for the transistors are relaxed, resulting in less distortion and/or lower specification and hence cheaper transistors.

In particular in this other aspect the present invention provides a power switching circuit according to claim 29.

Advantageously the power switching circuit can be combined with the double sided modulator of the second aspect and/or the quantising circuit of the first aspect.

There are also provided corresponding methods, and computer programs to implement said methods.

BRIEF DESCRIPTION OF THE DRAWINGS

Embodiments are described with respect to the following drawings, by way of example only and without intending to be limiting, in which:

FIG. 10b shows an architecture for the modulator of FIG. 10a;

DETAILED DESCRIPTION

Figure 1:
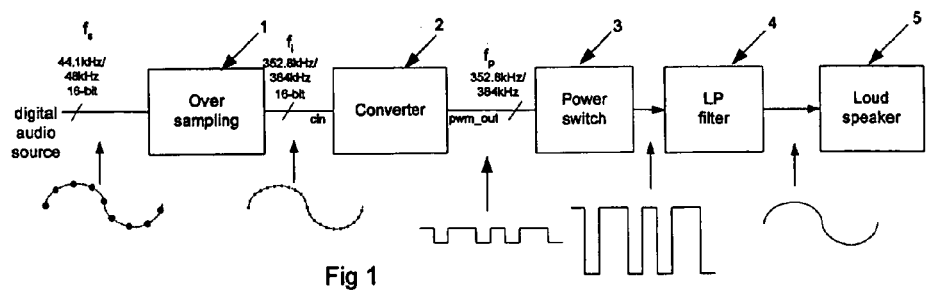
FIG. 1 shows a schematic of a digital audio amplifier.
Figure 2:
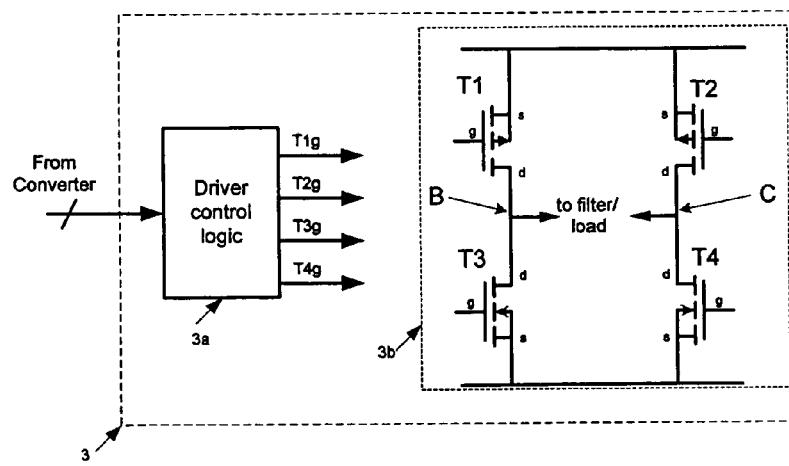
FIG. 2 shows a transistor switching bridge for the amplifier of FIG. 1.

As discussed previously, the arrangement of FIG. 1 can be used to provide audio output from coded sample values of the original analogue signal. Here pulse width modulation (PWM) techniques are used, in which the sample values are converted into pulses having a width corresponding to the input sample values, and which pulses are used to drive a power switching stage such as illustrated in FIG. 2.

Figure 4:
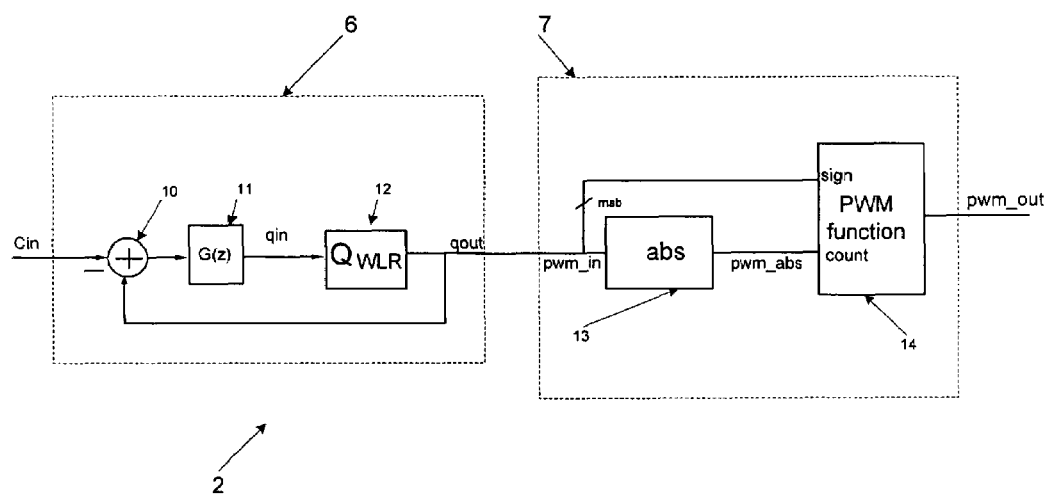
FIG. 4 shows a PWM converter for the amplifier of FIG. 1.

A PWM converter such as that shown in FIG. 4 is utilised to provide the pulses to drive the switching stage 3. The converter typically utilises a word length reduction circuit 6 coupled to a PWM modulator 7 which provides the actual conversion to pulse width coding.

Figure 5:
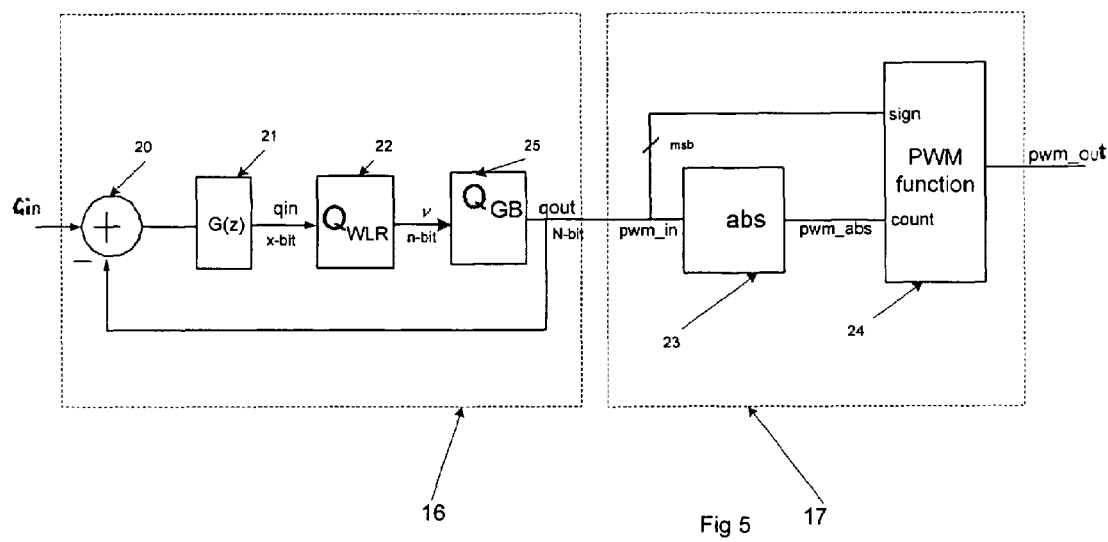
FIG. 5 shows a PWM converter having a guard-band quantiser according to an embodiment.

In one embodiment a modified word length reduction circuit 16 is provided for use with a tri-level PWM modulator 17 as shown in FIG. 5. Here a guard band quantiser $Q_{GB}$ 25 is utilised to modify the output characteristics of the word length reduction circuit 16. The word length reduction circuit 16 also comprises a "standard" multi-level word length reduction quantiser $Q_{WRL}$ 22, a loop filter 21, and a feedback loop adder 20 as with the word length reduction circuit 6 of FIG. 4.

In order to avoid the occurrence of short output pulses from the modulator 17, the word length reduction circuit 16 is modified to prevent it outputting values around zero. The guard band quantizer 25 has an upper threshold $T_U$ and a lower threshold $T_L$. The quantizer logic is arranged such that if the quantizer input is between $T_U$ and $T_L$, the quantizer will output either $T_U$, $T_L$, or zero, according to a predetermined transfer characteristic such that the quantizer error is minimised. If the input is greater than $T_U$ or smaller than $T_L$ then the signal from the standard quantiser 22 is passed unaltered such that the word length reduction circuit 16 operates as normal (ie the same as the circuit 6 of FIG. 4). This allows the minimum PWM pulse width to be controlled by setting the thresholds $T_U$ and $T_L$.

The word length reduction circuit 16 is multi-level and is implemented using the two quantizers: the first being the standard multi-level WLR quantizer 22, which quantizes its x-bit input to a signal v of lower wordlength, n-bit say. The second is the Guard-Band Quantizer 25, which implements a minimum pulse constraint to ensure that none of the codes or input signal values between $T_U$ and $T_L$ (except possibly and preferably zero) are used (i.e. it implements a guard band). To minimise the quantizer error, the following quantizer transfer characteristic is used, and can be seen in FIG.

Figure 6A:
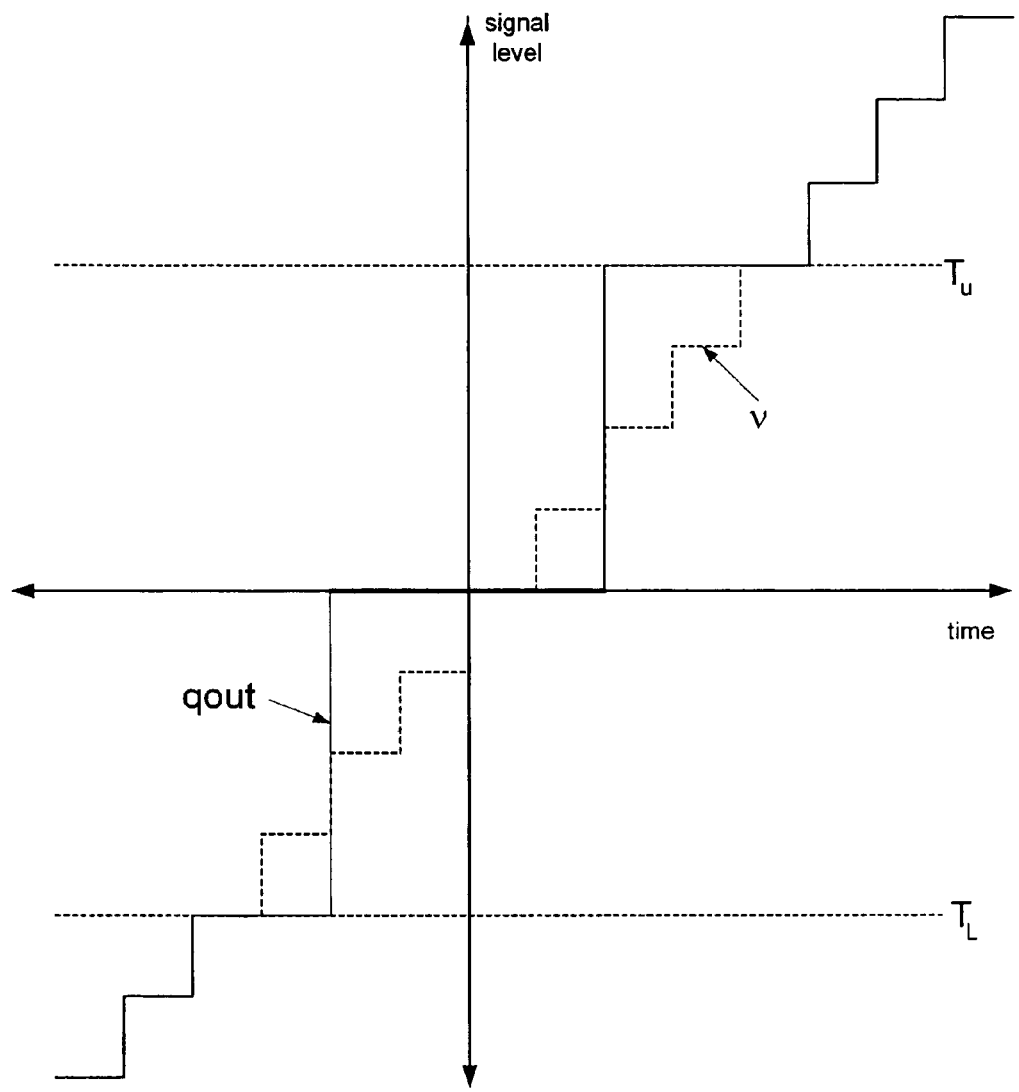
FIGS. 6a and 6b shows the output characteristics of the guard-band quantiser of FIG. 5.
Figure 6B:
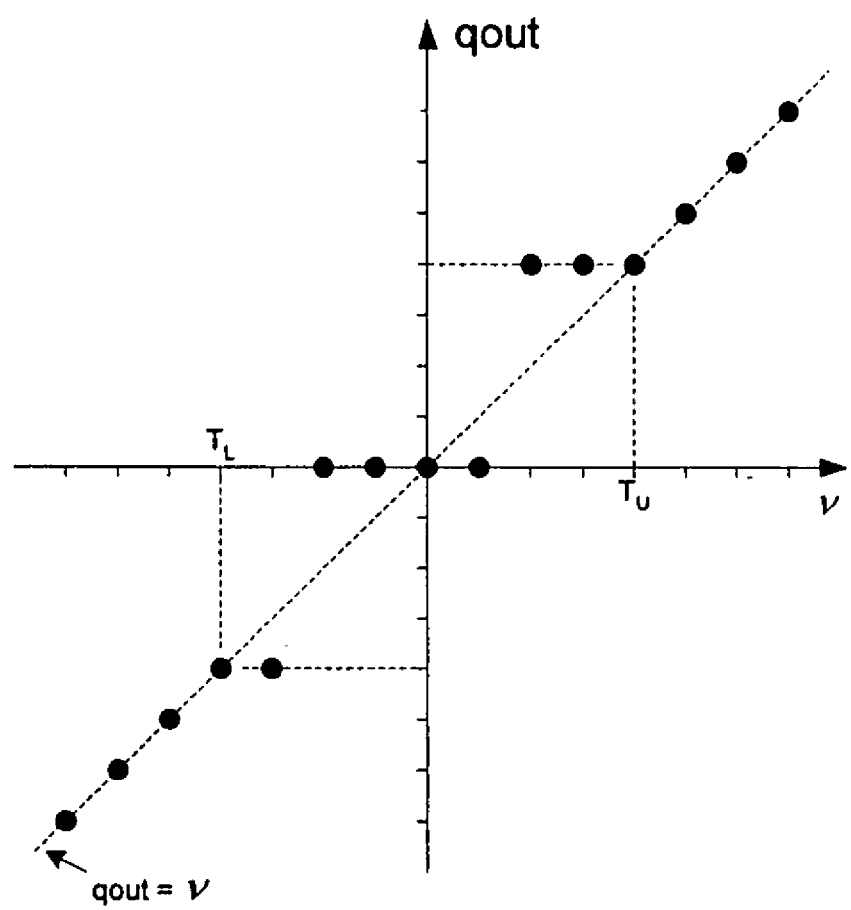

6a and FIG. 6b (although it will be clear to those skilled in the art that other characteristics could be used):

$$qout = \begin{cases} T_U & \text{if } T_U/2 \leq v \leq T_U \\ T_L & \text{if } T_L < v < T_L/2 \\ 0 & \text{if } T_L/2 \leq v < T_U/2 \\ v & \text{otherwise} \end{cases}$$

FIG. 6a shows both the input signal v (dashed line) and the output signal qout (solid line) of the guard band quantiser 25 as a function of time for a steadily increasing quantised input signal v. FIG. 6b illustrates the same quantizer transfer characteristic but plotting the discrete values of qout versus the discrete values of v as heavy dots, with the line qout=v shown dotted for comparison. It can be seen that at the signal levels below the lower threshold $T_L$ and above the upper threshold $T_U$, the output signal matches or follows the input signal. In other words the word length reduction circuit 16 operates like the analogous word length reduction circuit of FIG. 4. However at input signal levels v (or digital word values) between these thresholds $T_L$ or $T_U$ (i.e. those about zero, in this example within +/−4 LSB of v), the output of the guard-band quantiser 25 is either $T_L$, $T_U$ or zero; according to the above equations. Thus the quantiser 25 prevents output by the PWM modulator 17 of short pulses by outputting a an output chosen from a reduced set of predetermined output levels when the input signal is between $T_L$ and $T_U$. The reduced set could include just zero for simple implementations.

Usually, the N-bit output of guard-band quantiser 25 will be the same wordlength as its input, i.e. N will equal n, as implied by FIG. 6b. However this is not a necessary restriction, especially with the more complex circuits described below. Also it may be convenient in terms of implementation to further word length reduce, invert, bit-shift, scale, or zero-shift, or alter the numerical format of the output signal within the logic comprised in quantiser 25. However the overall operation would still be equivalent.

Figure 7A:
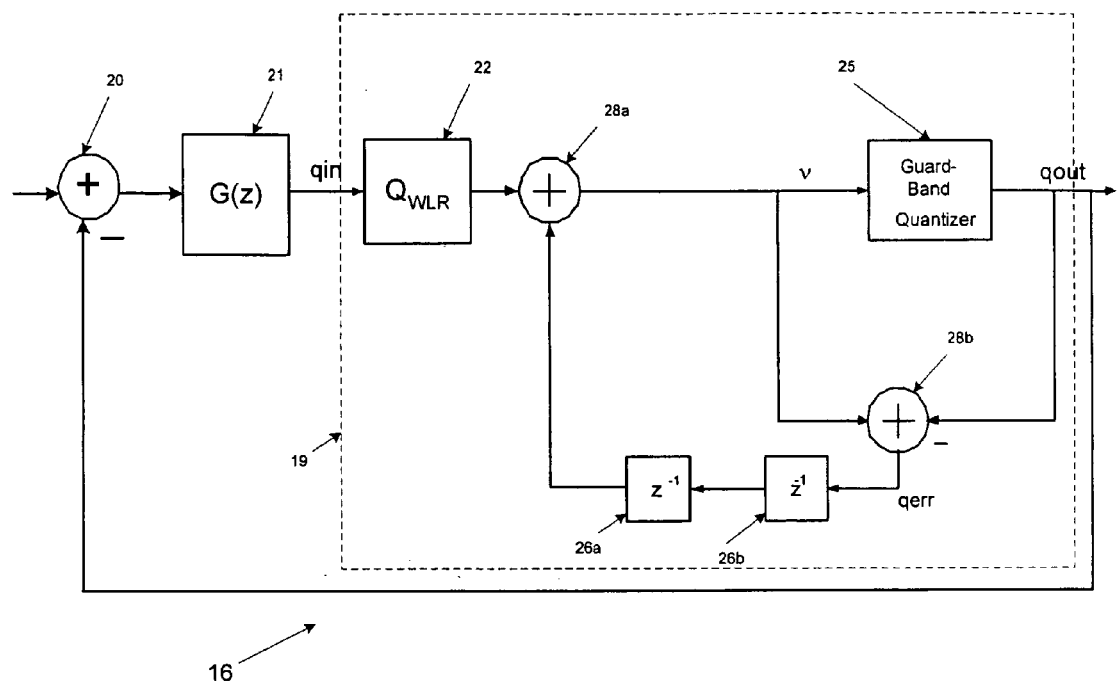
FIG. 7a shows the guard-band quantiser of FIG. 5 incorporating noise shaping.

Despite the fact that the guard band tri-level quantizer 25 is within the feedback loop of the noise-shaper or SDM WLR circuit 16, the error introduced can still limit the performance of the system. Therefore in a further embodiment, the error in the baseband is reduced by employing a further noise-shaping (inner) loop around the Guard-Band Quantizer 25. This is shown in FIG. 7a, which shows the word length reduction circuit 16 of FIG. 5, with two feedback loops—the inner noise shaping loop goes to adder 28a, and the outer SDM loop goes to adder 20.

Adder 28b compares the input v and output qout of the quantizer 25. For signals v outside the range TU to TL, this error will be zero; even for signals v within this range, the error is less than TU or TL, so will only be plus or minus a few LSB, so the bit width of the adder output and the subsequent feedback path will be small. In fact since the output of the guard band quantiser 25 is determined by its input, adder 28b need only look at the last few LSB of its inputs v and qout so its input is also only a few bits wide.

The inner loop filter (H(z)) is implemented as two delays 26a and 26b, each of a delay $1/f_P$. This implements the noise transfer function $1-z^{-2}$, which introduces a zero at DC and a zero at $f_P/2$. The zero at $f_P/2$ reduces the out-of-band noise introduced by the noise shaper. It is also possible to use a more general noise shaping filter in the feedback loop by replacing the two delays with a direct form noise shaper loop filter for example. This allows more flexibility in the shaping of the error introduced by the guard-band quantizer 25.

Figure 7B:
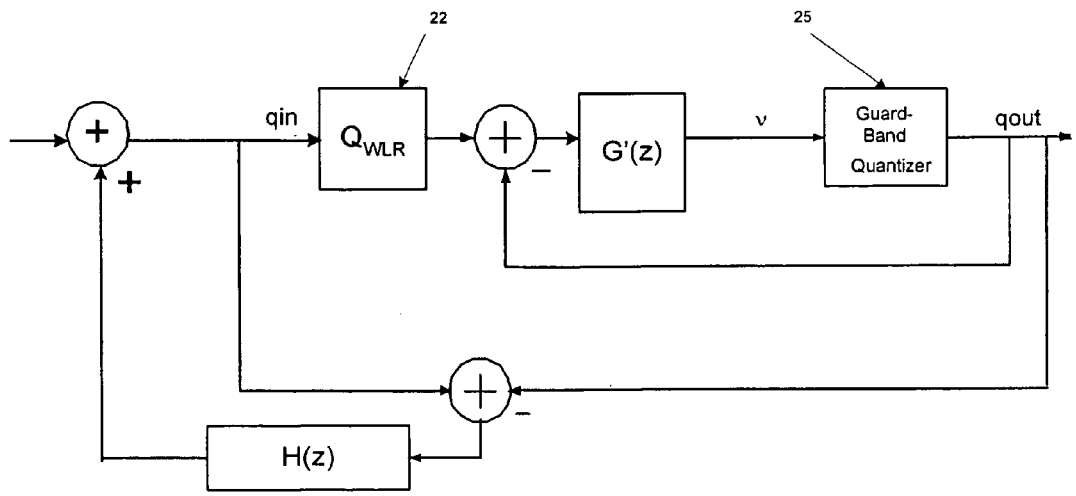
FIGS. 7b–7d show alternative guard-band quantiser and word length reduction arrangements using different quantisation noise spectrum shaping circuit architectures.
Figure 7C:
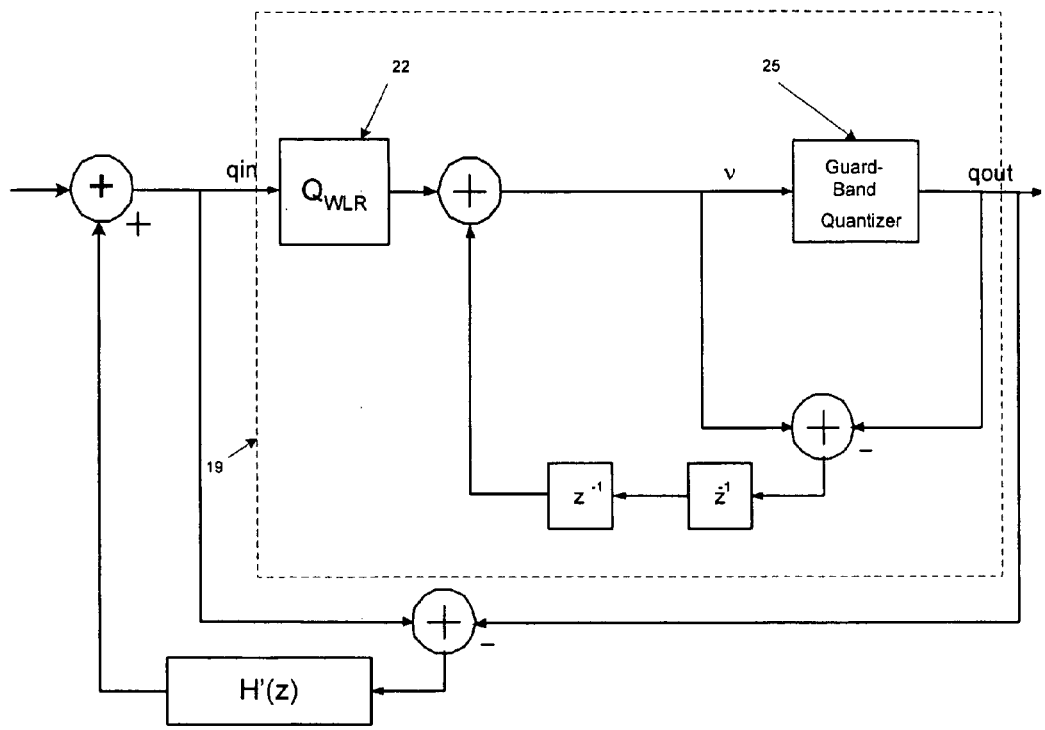
Figure 7D:
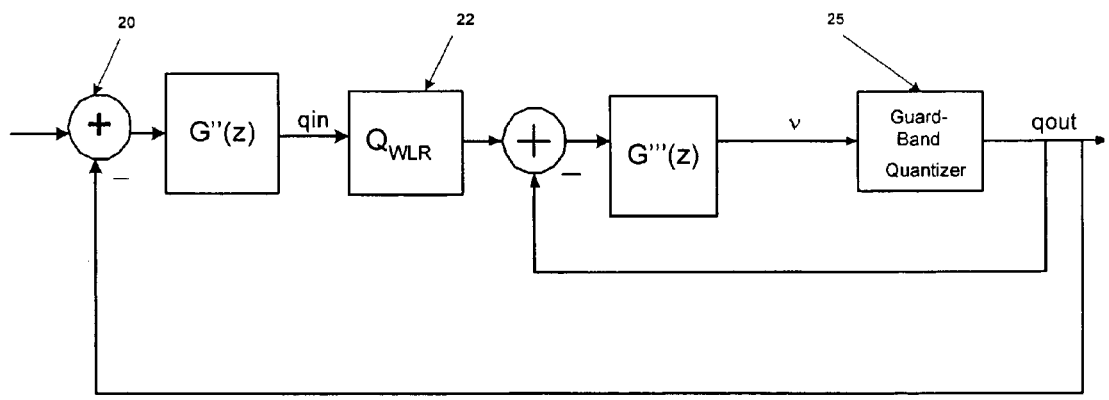

In alternative arrangements the word length reduction circuit 16 could be implemented as a noise shaper with a suitable loop filter H'(z) for the outer loop, as illustrated in FIG. 7c. Alternatively or additionally, the guard band quantiser or inner loop could be implemented as a SDM with a loop filter G'(z) or G(z)''' in the signal path, as shown in FIGS. 7b and 7d. FIG. 1b shows the option of having the word length reduction circuit 16 implemented as a noise shaper with loop filter H(z), and FIG. 7d has this circuit (16) implemented as a sigma delta modulator with loop filter G(z)'''.

Figure 8A:
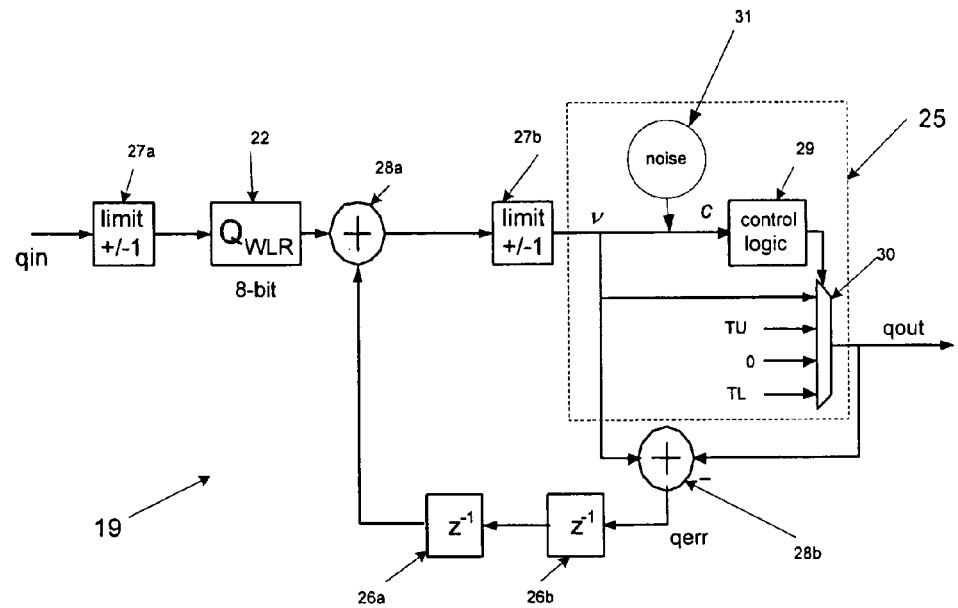
FIGS. 8a and 8b show circuit diagrams including more detail of the guard-band quantiser of FIG. 7 according to two embodiments.

FIG. 8a shows an implementation of the signal path from qin to qout (corresponding to the area 19 shown in FIG. 7a) in more detail. The structure includes limiters 27a, 27b to limit the maximum signal levels (to prevent digital wraparound, for example under overload conditions). The guardband quantizer 25 is implemented using a control logic block 29 which determines the conditions in the above equations for the quantizer transfer characteristic and according to FIGS. 6a, 6b. The output of this feeds into a multiplexer (or equivalent logic) 30, which chooses to output the appropriate one of v, TU, 0 or TL according to the equations. The noise shaper (inner) feedback loop is constructed from the two delay elements 26a and 26b and two adders 28a and 28b as shown. As described above, the feedback path through 28a, 26a, and 26b to 28a need only be a few bits wide.

As a further enhancement, the control logic 29 is also dithered, which randomises the selection of the quantizer 25 output to reduce idle tones. More specifically, if the error signal (v−qout) introduced by the quantiser is too closely correlated to the input signal, harmonic distortion can result. This can be avoided by introducing dithering or randomising of the output signal which is implemented here by adding a noise source 31 (shown dashed in the figure) to the input signal v to produce a dithered control signal c to the input of the control logic input. The noise source is simply a pseudo-random signal generated by known techniques that randomises slightly the selection of TU, TL, zero, or input signal. Assuming this noise source is bounded to a few LSBs, the feedback path through 28a, 26a, and 26b to 28a need still only be a few bits wide.

The added noise signal has two side-effects: Firstly input signals v slightly above TU, say, may give rise to an output signal equal to TU (or even 0 or TL), rather than passing through. This is because the noise signal (31) applied to the input signal v may subtract some of its amplitude resulting in a control signal c which is less than TU. Second, input signals v slightly below TU, say, may pass through the multiplexer to the output, giving rise to output signals corresponding to narrow pulse widths. This is because the noise will have taken the amplitude of the control signal c above TU which activates the multiplexer 30 to pass the input signal v which is slightly less than TU. However, at least for amplitudes of added noise small compared to TU, the general operation of the circuit is fundamentally equivalent to the circuits without dither, the predetermined range being made somewhat "fuzzy". The circuit still outputs an N-bit output signal corresponding to said n-bit input signal if said input signal is not substantially within said range and outputs an output level selected from a predetermined reduced set of output levels when the input signal is substantially within said range.

Figure 8B:
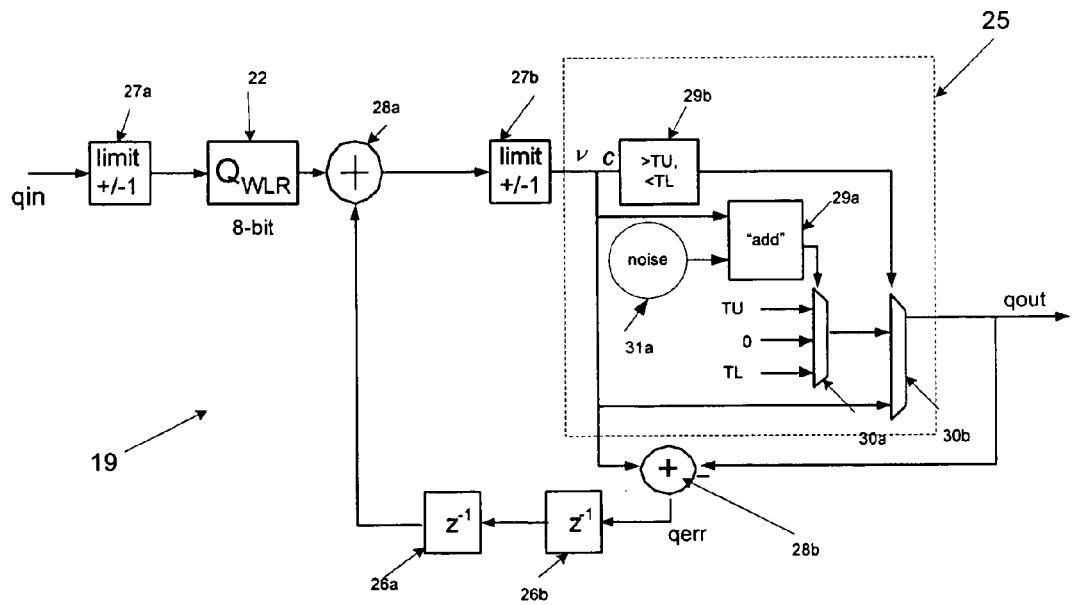

In a second embodiment, the control logic and multiplexers of quantiser 25 are modified as shown in FIG. 8b. This avoids adding noise to signals outside the predetermined range and therefore avoids outputting signals corresponding to output pulse widths narrower than desired, while still adding dither to decorrelate the added quantisation noise qerr from the audio signal. This is so even for dither of similar magnitude to TU.

The control logic block 29 is replaced by two control blocks 29a and 29b, and the multiplexer 30 is split into two stages 30a and 30b. Block 29b detects whether the signal falls outside the range from TU to TL, with no noise added to its input (control signal c equals input signal v). If so, it drives multiplexer 30b to pass the input signal v unchanged. If not so, i.e. if the input signal falls inside the range TU to TL, multiplexer 30b outputs the output from multiplexer 30a. The output from multiplexer 30a is either TU, TL or zero, according to the output of logic block 29a.

Logic block 29a implements a transfer function, for example as defined in the equations discussed earlier and as illustrated in FIGS. 6a and 6b. A noise source 31a is added to the input signal v (as opposed to the control signal c as in FIG. 8a) and the equations are then applied to the dithered input signal. Thus the signal (control signal c) which controls whether the input signal v is passed on to the output qout is not dithered, but the signal (input signal v) which determines which predetermined output level (TU,), TL) is selected if the input signal v is not passed to the output is dithered. Thus Logic block 29a essentially adds the noise signal 31a to the input signal, and then drives the multiplexer 30a to select TU, TL or zero according to a characteristic similar to that illustrated in FIGS. 6a and 6b. In this way, input signals outside the range TU to TL are never modified, and input signals v inside this range become TU, TL, or zero, but with dither added to the choice. The circuit still outputs an N-bit output signal corresponding to said n-bit input signal if said input signal is not within said range and outputs an output level selected from a predetermined reduced set of output levels (TU, 0, TL) when the input signal is within said range.

The operation performed by logic block 29a can be considered as an addition of the signal v to the noise signal, followed by a truncation to three levels. Alternatively it could be a predetermined combinatorial combination of the signal bits and the noise bits.

The PWM modulator 17 shown in FIG. 5 comprises an absolute block 23 which simply passes all bits except the MSB which is routed to the "sign" input of the pulse width modulator (PWM) function block 24. The absolute value of the input sample is fed to the "count" input of the PWM function block 24. For single-sided modulation, in this case trailing-edge single-sided modulation, at the start of each pulse-frame, the output is set to the same polarity as the 'sign' input and the pulse-width-counter is loaded with the "count" value. The pulse-width-counter is decremented every bit-clock cycle. When the output of the pulse-width-counter reaches zero, the output of the block is set to zero (i.e. to the "mid-scale" state). The functioning of PWM function blocks is described below in more detail with respect to FIG. 10.

A similar configuration for PWM function block 24 can be derived in which the pulse-width-counter is initially set to zero, and increased until it reaches the "count" value to produce the correct pulse-width.

As discussed above, in standard or single sided PWM, only the leading or trailing edge of the pulse varies with the input signal, the other edge being fixed. In double-sided PWM, both leading and trailing edge of the pulse vary in order that the PWM pulses are centred around the PRF (Pulse-Repetition Frequency) clock at frequency $f_P$. Double sided PWM is more complicated to implement, but results in reduced distortion when compared with single sided PWM.

The digital PWM modulator 17 can also be modified to produce double-sided modulation. For double sided modulation, an additional 'offset' signal is input to the PWM block. The block has an additional counter used to time the period to the start of the pulse, hereafter labelled 'offset-counter'. At the start of the pulse-frame, the output is set to zero, the offset-counter is loaded with the offset value, and the pulse-width counter is loaded with the count value. The offset counter is decremented on every bit-clock pulse. When the counter output reaches zero, the output is set to the same polarity as the 'sign' input, and the pulse-width-counter is decremented, as before, until its value reaches zero. At this point, the output of the PWM block is set to zero again. The 'offset' signal is generated so as to centre the pulse on the pulse-frame.

A problem with digital implementation of double sided PWM however is that if the output of the quantizer is odd, the pulse cannot be exactly centred. This problem has been addressed by alternatively shuffling each odd-length PWM pulse to the left then right on alternate samples. This is explained for example in R. E Hiorns, A. C. Paul and M. B. Sandier, "A Modified Noise Shaper Structure for Digital PWM DACs.", AES 95$^{th}$ Convention, 1993 Oct. 7–10. The performance of such a shuffling or alternating scheme can however limit the overall performance of the system, by introducing distortion.

Figure 9:
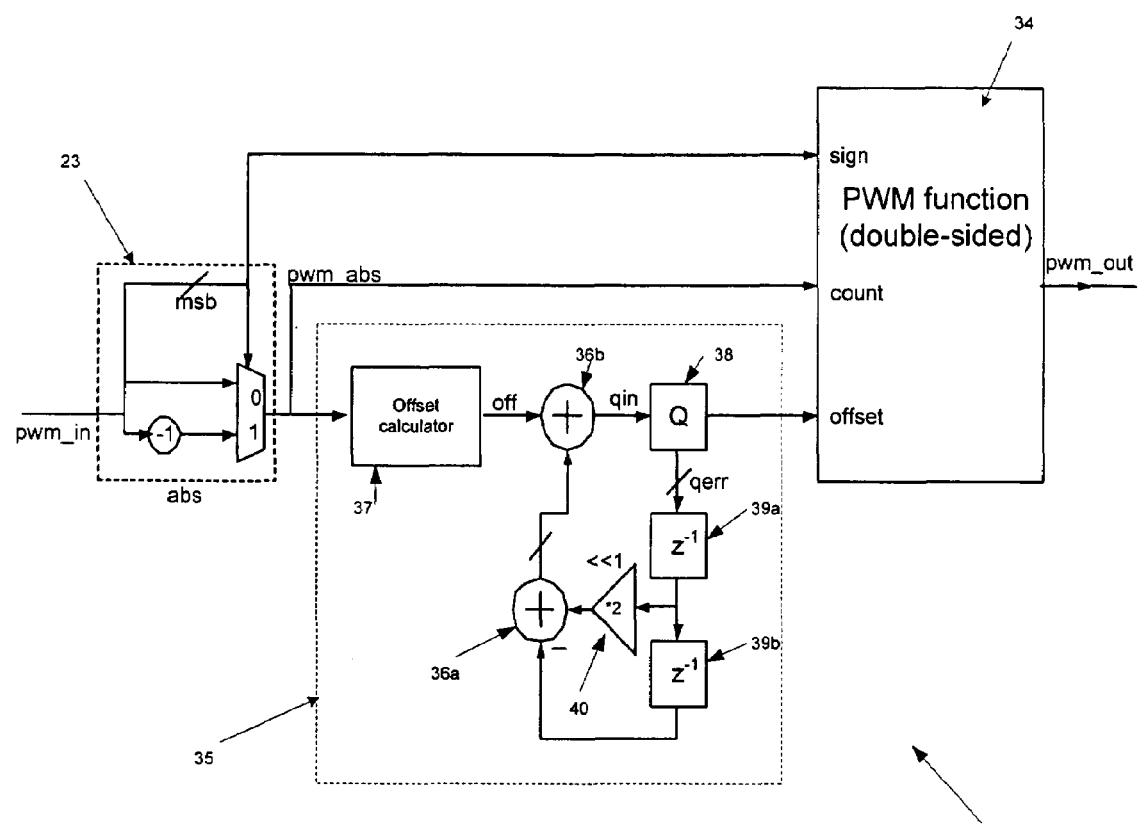
FIG. 9 shows a double-sided tri-level PWM modulator implementation according to another embodiment.

In a further embodiment, a double-sided PWM modulator (33), suitable for replacing the single-sided PWM modulator 17, is shown in FIG. 9, including an improved shuffling scheme which is enhanced by using noise shaping around the shuffler. This double-sided PWM modulator circuit 33 comprises an absolute value circuit 23, a shuffler circuit 35, and the PWM function block 34. The PWM function block 34 is described in detail below with respect to FIG. 10a, and has an additional "offset" input compared with the PWM function block 24 of FIG. 5. The "offset" input receives a signal from the shuffler circuit 35, which provides an offset value for the PWM function block 34 in order to instruct the PWM block where to position the pulse in the pulse-frame. The shuffler utilises second order noise shaping which has the effect of reducing the low frequency error introduced by the shuffling. Similarly to the topology choices outlined with respect to FIG. 7, delta-sigma techniques for noise-shaping could be used instead, whose implementation would be apparent to those skilled in the art.

The shuffling circuit 35 comprises two adders 36a and 36b, an offset calculator 37, a quantiser 38, and two delays 39a and 39b. There is also a left shift, or multiply-by-2, circuit 40.

The offset calculator 37 calculates the offset "off" required to centre each PWM pulse within each pulse frame. It is convenient to keep the offset a positive number, so the calculator 37 is arranged to calculate the offset using the equation:

$$\text{off}=(\text{pulse\_frame\_width}-\text{pwm\_abs})/2$$

where pulse_frame_width is the number of bit-clocks per PWM frame. If pwm_abs is zero, say, off will be equal to pulse_frame_width/2, representing an instant half way through the 128 (say) bit-clock cycles in a PWM pulse frame. As pwm_abs increases, off will reduce at half a bit-clock period per unit of pwm_abs. For example, if the pulse frame width is 128 bit-clock periods, and pwm_in=64, pwm_abs will also be 64, and the output of the offset calculator will have the value 32.

Figure 10A:
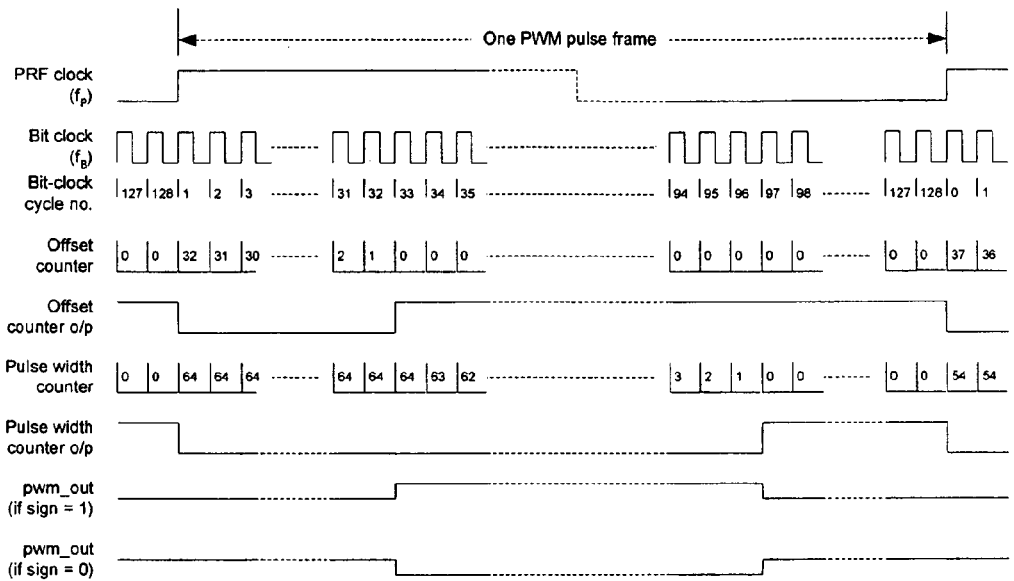
FIG. 10a illustrates a pulse output and its correspondence with counter values in a modulator.

Referring now to FIG. 10a and the above example, a pulse frame is shown containing an output pulse at pwm_out having a width corresponding to the absolute value (count) of the input signal to the PWM modulator 34. The pulse is offset from the start of the pulse frame by the offset calculated by the offset calculator 37. The value of the offset will depend on the input signal corresponding to the width of the pulse. The "aim" of the offset is to centre the pulse within the pulse frame. Thus the offset counter counts 32 clock pulses, and then sets the width counter to count 64 clock pulses in order to obtain a pulse of the appropriate width as shown.

In this example, pwm_in=64, an even value, so the output off of the offset calculator will have the integer value 32. But if the pwm_in signal is of odd-length (e.g. 63), off will have a fractional value (e.g. 32.5).

The offset value (off) is processed by a noise-shaping structure in the shuffler 35 which contains a quantizer 38. The quantizer 38 contains logic which rounds or truncates the input signal to an integer number, as required by the PWM function block 34. This quantization process introduces an error, which is noise-shaped by the loop comprising the adders 36a and 36b, and delays 39a and 39b. In this embodiment, a second-order loop filter is used, though other loop filter types could also be used. The noise-shaping loop ensures that the error introduced by the quantizer has a time-average of zero, so for example, a constant input off from the offset calculator of 32.5 would for example produce outputs oscillating between 32 and 33, with an average of 32.5, and with energy spectrally shaped to give little quantisation noise in the audio band.

Figure 10B:
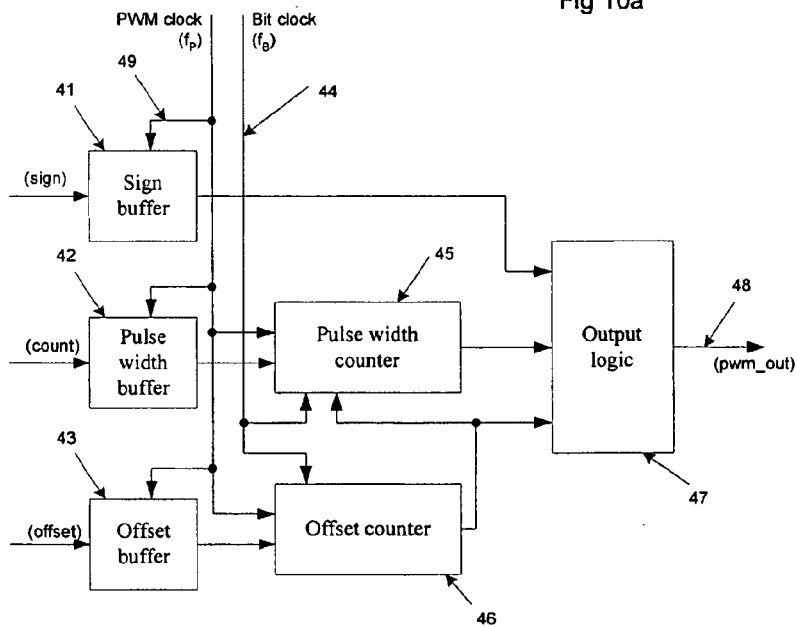

FIG. 10b shows an arrangement for the PWM modulator 34 and which comprises a sign buffer 41 coupled to the sign input, a pulse width buffer 42 coupled to the count input, and an offset buffer 43 coupled to the offset input. The modulator also receives a clock 44 which is set to the bit-clock rate $f_B$ of the modulator, and a clock 49 at the PRF or PWM pulse frame rate $f_P$. The modulator also comprises a pulse width counter 45, an offset counter 46 and an output logic block 47, delivering an output pwm_out suitable for controlling the power stage 3 of FIG. 2.

At the start of a pulse frame, the PRF clock edge latches the respective input signals into the three buffers 41, 42, and 43. It then loads offset into the offset counter and count into the pulse-width counter. The offset counter starts decrementing at clock rate $f_B$ until it reaches zero after "offset" $f_B$ clock periods. It then outputs a signal to the output logic 47 which then changes pwm_out from a zero or mid-scale state to a high or low level state according to the polarity of the latches sign signal. The change in offset counter output signal then starts the pulse width counter decrementing, so that after a further "count" $f_B$ clock periods the pulse width counter output signal changes. This signal change then prompts the output logic 47 to return pwm_out to a zero or mid-scale state. At the end of the pulse frame the outputs of the counters are reset, and the cycle repeats.

Whilst this embodiment has been described with respect to a tri-level implementation, this noise shaped shuffling technique of producing an integer offset for double-sided PWM can also be applied to bi-level or other multi-level PWM.

In a further embodiment, a modified switching scheme is applied to the output transistor switching bridge 3b of FIG. 2.

In general, high and low states are achieved with diagonally opposite MOSFETs conducting (T1 and T4, T2 and T3 respectively). For tri-level modulation, the zero or mid-scale state is achieved with either the top two (T1 and T2) or lower two MOSFETs (T3 and T4) conducting. For positive input signals, the output oscillates between the high and zero state, and for negative input signals, the output oscillates between the low and zero state.

Figure 3A:
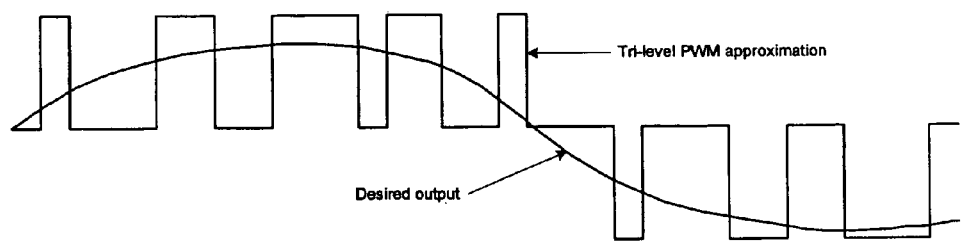
FIG. 3a shows a tri-level pulse width modulated representation of an audio signal.
Figure 3B:
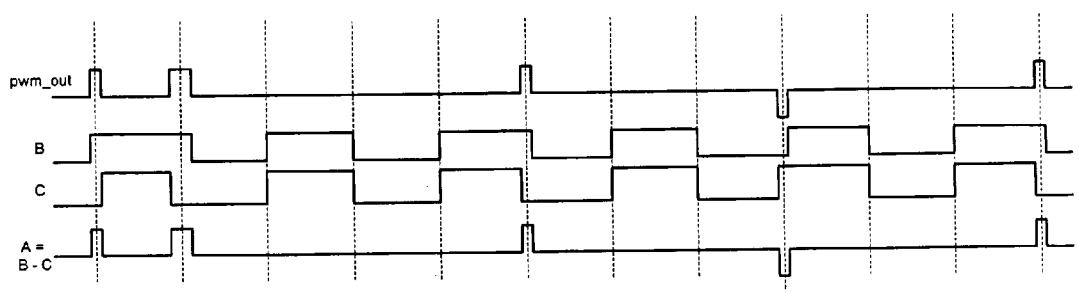
FIGS. 3b and 3c show known bridge transistor switching schemes.
Figure 3C:
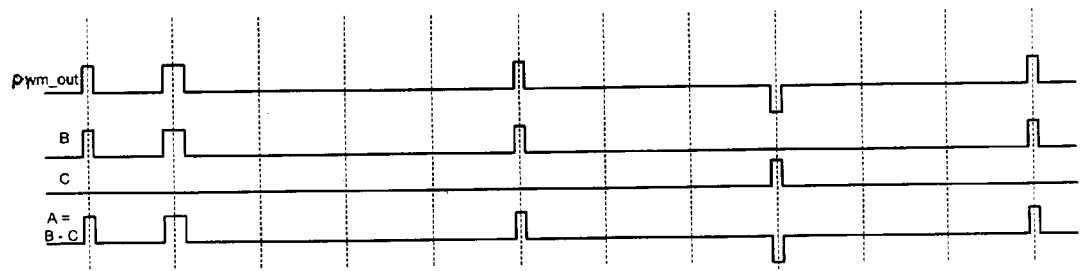

As discussed above, there are various possible schemes for choosing which of the two zero-state modes of operation to use at various parts of the waveform. FIG. 3b illustrates waveforms for a scheme with wide minimum pulse widths at B and C, but with a large common-mode component, possibly giving EMI problems. Additionally, and with both B and C are switched every cycle, giving significant loss of efficiency for small signals due to power dissipated in the pre-drivers. FIG. 3c shows a scheme with little common-mode component, at least for small signals (low duty cycle), and B and C not switching during cycles of "zero" signal, but requiring very small pulse widths at B and C.

Figure 11:
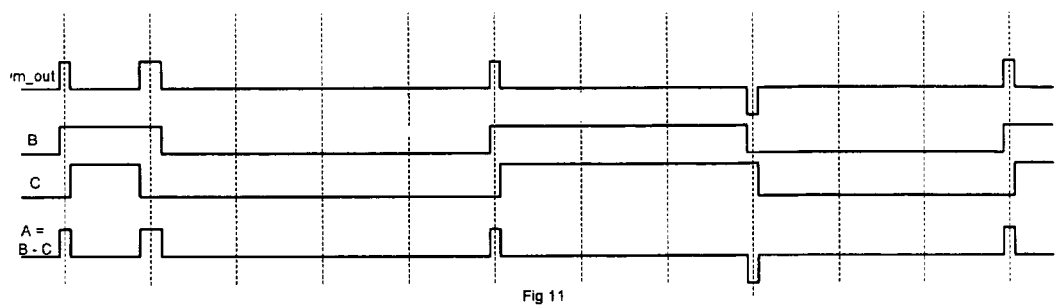
FIG. 11 shows a bridge transistor switching scheme according to an embodiment.

FIG. 11 shows waveforms of an alternative scheme according to an embodiment, where switching transitions are reduced as in the FIG. 3c scheme, to reduce pre-driver power consumption, but without the distortion limitations of short pulses discussed above. There is still more common-mode energy than in FIG. 3c, but in many applications (e.g. portable applications with speakers in the body of the device) this is of less concern than minimising power dissipation. Also the common-mode components are now no longer centred around harmonics of half the PWM carrier frequency, but will be spread over a wider bandwidth and be more noise-like, rather than generating troublesome discrete high-frequency signals. A further advantage compared to the scheme of FIG. 3b is that if the FETs are not perfectly matched, every transition in each half-bridge which does not cause a transition in the output will cause a switching glitch across the load. This could result in increased distortion and noise.

The switches are controlled such that the minimum pulse width applied to each half-bridge T1–T3 and T2–T4 is increased compared with the scheme of FIG. 3c. It can be seen that by configuring the half-bridge control waveforms B and C, some of the applied pulses or voltage highs cancel each other resulting in the required short duration pulse in the load waveform A, but without requiring corresponding short pulses in the half-bridge control waveforms—i.e. The switching speeds of the transistors is relaxed without affecting the output waveform A.

Thus the switching is arranged to provide a state transition (ie +1 to 0, 0 to +1, 0 to −1, or −1 to 0) at one of the nodes B or C, only when a corresponding state transition occurs in the PWM output signal. This avoids the continuous switching of the scheme of FIG. 3b, even for low signal values. However use is made of both node B and C states to provide the output A, in order to reduce the requirement for short duration pulses in each of the B and C nodes. Thus a non-zero pulse across the load (A) is implemented by a state transition at one of the load connections (B or C) followed after a period corresponding to the width of the pulse by a state transition at the other load connection (C or B).

Referring to the waveforms A, B and C in FIG. 11 in more detail, it can be seen that initially the output level A is zero, and this is provided by low levels on both half-bridge drain connections or nodes (see B and C). The two low levels provide no voltage difference across the load and hence a zero output value (A). Then the T1–T3 (B) node is switched high, causing the output voltage across the load (A) to be positive. Next the T2–T4 node (C) is switched high, causing zero voltage (A) across the load again. Thus switching of both half-bridges is involved in producing the short pulse instead of a single half-bridge as in the arrangement of FIG. 3c.

Figure 12:
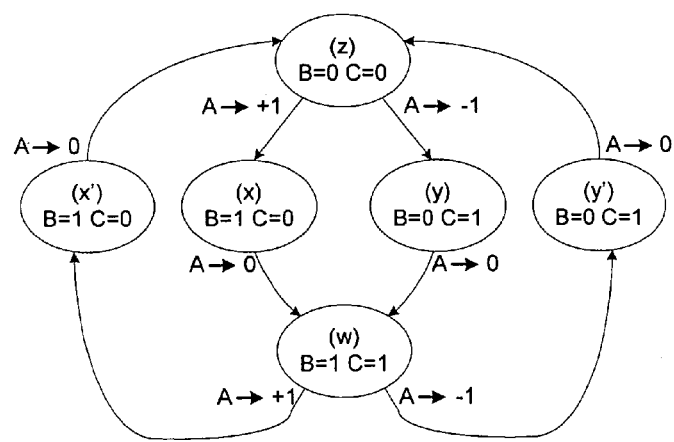
FIG. 12 shows a state diagram further illustrating the scheme of FIG. 11.

FIG. 12 illustrates a mechanism for implementing the switching control for the half-bridge outputs, B connected to T1 and T3 and C connected to T2 and T4, given a wanted output A=B−C for the load. The fundamental idea is that when a transition from a non-zero state to a zero-state is required, the alternate set of switches is used—in other words if the last transition to zero output (A=0) was provided by switching the T1–T3 (B) half-bridge, then this time the T2–T4 (C) half-bridge is to be used. This ensures that any required short pulses are not completely provided by switching just the one half-bridge (B or C). Using both alternatively reduces the effect of the finite slew rate of the transistors. In fact the slew rates of both edges comprising one of these short pulses will tend to be similar, so some cancellation of any effects is obtained.

In more detail, starting from the state A=0, with B=0, C=0 (z), if A then transitions to +1, output B is switched high, to give B=1, C=0 (x). When A returns to zero (preceding logic prohibits transition from A=1 to A=−1), since B was last switched, C is now switched high, to give the alternate zero state B=1 C=1 (w). If A had initially transitioned to −1, then C would have switched first, to give B=0, C=1 (y), then when A returned to zero, B would have been switched, to give the same alternate zero state B=1, C=1 (w).

Similarly, starting from the state A=0, with B=1, C=1 (w), if A then transitions to +1, output C is switched low, to give B=1, C=0 (x'). When A returns to zero, since C was last switched, B is now switched low, to give the zero state B=0 C=0 (z). If A had initially transitioned to −1, then B would have switched first, to give B=0, C=1 (y'), then when A returned to zero, C would have been switched, to give the same zero state B=0, C=0 (z).

More generally, the last half bridge (A or B) that switched the output (A) is determined, in order that the next output mid-scale switch is implemented using the other half bridge (B or C). This ensures that any required short pulses are not completely provided by switching just the one half bridge (B or C), but that both are used in order to reduce effect of the finite slew rate of the transistors.

This logic state diagram can readily be implemented in software or logic circuits, for example DSP or ASICs, as would be apparent to those skilled in the art. Where T1 is PMOS and T3 is NMOS as shown in FIG. 2, the drive waveforms for the gates of T1 and T3 are nominally identical and the inverse of the required level at B. In practice some underlap will be added to the waveforms actually applied to the gates, to avoid both transistors being on at the same time and causing a momentary low-resistance path directly between the supplies. Similarly for T2 and T4.

Where T1 and T2 are also NMOS rather than PMOS, the waveform at T1 has to be inverted with respect to that of T3, and probably level shifted to a higher voltage, as is well known in the art.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

The invention claimed is:

1. A quantiser circuit for use with a pulse width modulator, the quantiser circuit comprising:
   means for receiving an input signal;
   means for providing a control signal dependent on said received input signal;
   means for determining if the control signal is within a predetermined range;
   means for outputting an output signal corresponding to said input signal if said control signal is not within said range and outputting an output signal having a level selected from one of a number of predetermined levels when the control signal is within said range.

2. A circuit according to claim 1 wherein the control signal equals the input signal.

3. A circuit according to claim 2 wherein the control signal providing means is arranged to output the input signal as the control signal, the circuit further comprising means for dithering which receives the input signal and outputs a dithered input signal, and wherein the selected level is dependent on said dithered input signal.

4. A circuit according to claim 3 wherein the dithering means comprises a pseudorandom noise source and is arranged to add this to the input signal.

5. A circuit according to claim 1 wherein the control signal providing means comprises means for dithering which receives the input signal and outputs a dithered input signal as the control signal, and wherein the circuit is further arranged such that the selected level is dependent on the control signal.

6. A circuit according to claim 1 wherein the modulator is a tri-level modulator and the predetermined range is centred about a zero signal level.

7. A circuit according to claim 6 wherein the predetermined levels include zero and the bounds of the range.

8. A circuit according to claim 7 wherein said quantising circuit is further arranged to force said output signal to a non-zero threshold value when said corresponding input signal is within a predetermined range of said threshold value.

9. A circuit according to claim 8 wherein the quantising circuit comprises control logic and a multiplexer having inputs from said forced output value and said input signal, the control logic arranged to switch between the input signal and the forced output value when said corresponding input signal is within said predetermined range.

10. A circuit according to claim 1 wherein the modulator is a tri-level modulator wherein the quantising circuit is arranged to force said output signal to a non-zero upper threshold value when said corresponding input signal is within a predetermined range of said upper threshold value and to force said output signal to a non-zero lower threshold value when said corresponding input signal is within a predetermined range of said lower threshold value.

11. A circuit according to claim 1 wherein the modulator is a tri-level modulator wherein the quantising circuit is arranged to force said output signal to a zero value when said corresponding input signal is within a predetermined range of zero.

12. A circuit according to claim 1 comprising switching means arranged to switch having an output switchable between the input signal and said predetermined levels and control logic arranged to switch the input signal to the output when the control signal is outside the predetermined range and to switch a said predetermined level to the output otherwise.

13. A circuit according to claim 12 wherein the control logic is further arranged to switch the switching means between predetermined levels depending on the input signal.

14. A circuit according to claim 12 further comprising a pseudorandom noise source and an adder arranged to add the noise to the input signal, the output of the adder coupled to the control logic to provide the control signal.

15. A circuit according to claim 12 further comprising a second switching means and second control logic arranged to switch the second switching means between predetermined levels depending on the input signal.

16. A circuit according to claim 15 further comprising a pseudorandom noise source and an adder arranged to add the noise to the input signal, the output of the adder coupled to the second control logic.

17. A circuit according to claim 1 wherein said quantising circuit further comprises a feedback loop from the output to the input of the quantising circuit.

18. A circuit according to claim 17 further comprising a delay or filter in order to implement a sigma delta modulator or noise shaping circuit.

19. A word length reduction circuit for a pulse width modulator, the circuit comprising:
 a quantising circuit according to claim 1; and
 a second quantising circuit coupled to an input of the first quantising circuit and comprising:
  an input for receiving an x-bit input signal;
  quantising means arranged to quantise said x-bit signal into a corresponding n-bit output signal; and
  an output for outputting said n-bit output signal to said first quantising circuit.

20. A circuit according to claim 19 and further comprising a feedback loop from the output of the first quantising circuit to the input of the second quantising circuit, a loop filter and an adder arranged to implement a sigma delta modulator or noise shaper circuit.

21. A PWM converter circuit comprising means for modulating an N-bit input signal into an output pulse having a width proportional to the level of said N-bit signal, and a circuit according to claim 1 and coupled to the input of the modulating means.

22. A circuit according to claim 21 wherein said modulating means is arranged for implementing double-sided modulation, and comprises a shuffling circuit for controlling a pulse offset in order to vary the position of the leading edge of the output pulses, a quantiser coupled to the shuffling circuit and a noise shaping circuit around the quantiser.

23. A circuit according to claim 22 wherein the shuffling circuit is arranged to alternately add or subtract from the offset value when the input signal is odd.

24. A circuit according to claim 22 wherein the noise shaping circuit is second or higher order.

25. A digital audio signal amplifier comprising a PWM converter circuit according to claim 21.

26. An amplifier according to claim 25 wherein the modulator provides a tri-level PWM output signal; the amplifier further comprising:
 a power switching circuit comprising four transistors arranged into two half bridges each having a load connection at the common connection of the respective transistors for a load to be connected between these two load connections; means for independently switching the two transistor half bridges dependent on the PWM output signal in order to provide an amplified modulator output signal;
 wherein the switching means is arranged to only provide a state transition at one of said load connections when a corresponding state transition occurs in said PWM output signal, and wherein a non-zero pulse across the load is implemented by a state transition at one of said load connections followed by a period according to the width of the pulse by a state transition at the other load connection.

27. An amplifier according to claim 26 wherein the switching means comprises means for determining the last half bridge that switched the output, in order that the next output mid-scale switch is implemented using the other half bridge.

28. A circuit according to claim 1 wherein the means for determining monitors the amplitude of the control signal to determine if the control signal is within a predetermined range.

29. A quantiser circuit for coupling to a pulse width modulator arranged to output pulses having a width dependent on the output signal of said quantiser circuit, the quantiser comprising:
 an input for receiving an input signal;
 quantising means for quantising said input signal into a corresponding output signal, and further having a minimum pulse width constraint and arranged such that an input signal having a non-zero value and corresponding to an output signal which in turn corresponds to a pulse of said modulator having a width less than said constraint is quantised into a corresponding signal having either a zero value or a value corresponding to a modulator pulse width greater than said constraint.

30. A tri-level PWM amplifier comprising:
 a modulator for providing a tri-level PWM output signal for amplification by a power switching circuit comprising four transistors arranged into two half bridges each having a load connection at the common connection of the respective transistors for a load to be connected between these two load connections;
 means for independently switching the two transistor half bridges dependent on the PWM output signal in order to provide an amplified modulator output signal;
 wherein the switching means is arranged to only provide a state transition at one of said load connections when a corresponding state transition occurs in said PWM output signal, and wherein a non-zero pulse across the load is implemented by a state transition at one of said load connections followed by a period according to the width of the pulse by a state transition at the other load connection.

31. An amplifier according to claim 30 wherein the switching means comprises means for determining the last half bridge that switched the output, in order that the next output mid-scale switch is implemented using the other half bridge.

32. A modulation circuit, comprising:
circuitry for implementing double-sided modulation, including a shuffling circuit which generates a pulse offset value for controlling the position of the leading edge of the output pulses, a quantiser having a feedback loop and which is coupled to the output of the shuffling circuit in order to round the pulse offset value to an integer when it is not an integer.

33. A circuit according to claim 32 further comprising a noise shaping circuit in the feedback loop.

34. A circuit according to claim 33 wherein the noise shaping circuit is second or higher order.

35. A method for quantising the input signal for a pulse width modulator, the method comprising:
receiving an input signal;
providing a control signal dependent on said received input signal;
determining if the control signal is within a predetermined range;
outputting an output signal corresponding to said input signal if said control signal is not within said range and outputting an output signal having a level selected from one of a number of predetermined levels when the control signal is within said range.

36. A method according to claim 35 wherein the control signal equals the input signal.

37. A method according to claim 36 wherein the control signal is the input signal, further comprising providing a dithered input signal, and wherein the selected level is dependent on said dithered input signal.

38. A method according to claim 37 further comprising dithering the input signal to provide the control signal, and wherein the selected level is dependent on the control signal.

39. A method according to claim 35 wherein the control signal is the input signal, further comprising providing a dithered input signal, and wherein the selected level is dependent on said dithered input signal.

40. A method according to claim 39 further comprising dithering the input signal to provide the control signal, and wherein the selected level is dependent on the control signal.

41. A method according to claim 40 wherein the predetermined level includes zero and the bounds of the range.

42. A method according to claim 35 wherein the modulator is a tri-level modulator and the predetermined range is centered about a zero signal level.

43. A method according to claim 35 further comprising forcing said output signal to a non-zero threshold value when said corresponding input signal is within a predetermined range of said threshold value.

44. A method according to claim 35 wherein the modulator is a tri-level modulator and the method further comprises forcing said output signal to a non-zero upper threshold value when said corresponding input signal is within a predetermined range of said upper threshold value and forcing said output signal to a non-zero lower threshold value when said corresponding input signal is within a predetermined range of said lower threshold value.

45. A method according to claim 35 wherein the modulator is a tri-level modulator and the method further comprises forcing said output signal to a zero value when said corresponding input signal is within a predetermined range of zero.

46. A method for word length reducing an input signal for a pulse width modulator, the method comprising:
receiving an x-bit input signal;
quantising said x-bit signal into a corresponding n-bit signal;
quantising said n-bit signal according to the method of claim 35.

47. A method of PWM converting an input signal comprising quantising said input signal according to the method of claim 35, and modulating said quantised input signal into an output pulse having a width proportional to the level of said quantised signal.

48. A method according to claim 47 further comprising implementing double-sided modulation by controlling a pulse offset in order to vary the position of the leading edge of the output pulses, quantising and noise shaping said offset.

49. A computer program comprising processor code for controlling a processor to implement the method according to claim 35.

50. A method for quantising the input signal for a pulse width modulator arranged to output pulses having a width dependent on the output signal of said quantiser circuit, the method comprising:
receiving an input signal;
quantising said input signal into a corresponding output signal, and providing a minimum pulse width constraint such that an input signal having a non-zero value and corresponding to an output signal which in turn corresponds to a pulse of said modulator having a width less than said constraint is quantised into a corresponding signal having either a zero value or a value corresponding to a modulator pulse width greater than said constraint.

51. A method of switching a power switching circuit comprising four transistors arranged into two half bridges each having a load connection at the common connection of the respective transistors such that a load is connected between these two load connections, the switching circuit coupled to a modulator providing a tri-level PWM output signal; the method comprising:
independently switching the two transistor half bridges dependent on the PWM output signal in order to provide an amplified modulator output signal;
wherein the switching is arranged to only provide a state transition at one of said load connections when a corresponding state transition occurs in said PWM output signal, and wherein a non-zero pulse across the load is implemented by a state transition at one of said load connections followed by a period according to the width of the pulse by a state transition at the other load connection.

52. A method according to claim 51 further comprising determining the last half bridge that switched the output, in order that the next output mid-scale switch is implemented using the other half bridge.

* * * * *